(12) United States Patent
Takahashi

(10) Patent No.: US 7,547,638 B2
(45) Date of Patent: Jun. 16, 2009

(54) METHOD FOR MANUFACTURING SEMICONDUCTOR DEVICE

(75) Inventor: Akira Takahashi, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 140 days.

(21) Appl. No.: 11/423,154

(22) Filed: Jun. 9, 2006

(65) Prior Publication Data

US 2006/0286687 A1  Dec. 21, 2006

(30) Foreign Application Priority Data

Jun. 20, 2005  (JP) .............................. 2005-179413

(51) Int. Cl.
*H01L 21/302* (2006.01)
(52) U.S. Cl. ...................... 438/717; 438/253; 438/396; 438/738; 257/E21.02
(58) Field of Classification Search ................. 438/253, 438/396, 717, 738, 736; 257/E21.02
See application file for complete search history.

(56) References Cited

U.S. PATENT DOCUMENTS 6,534,809 B2 *  3/2003  Moise et al. ................. 257/295

FOREIGN PATENT DOCUMENTS

JP  2003-258201 A  9/2003
JP  2003-273326 A  9/2003

* cited by examiner

*Primary Examiner*—Matthew Smith
*Assistant Examiner*—Julio J Maldonado
(74) *Attorney, Agent, or Firm*—Rabin & Berdo, PC.

(57) ABSTRACT

A method for manufacturing a semiconductor device includes the steps of forming a circuit element on a semiconductor substrate, forming an insulation film covering the circuit element, forming a first electrode on the insulation film, forming a ferroelectric film on the first electrode, forming a second electrode on the ferroelectric film, forming a hardmask comprised of lower, middle, and upper layer mask films on the second electrode, etching the second electrode using the upper layer mask film as an etching mask, removing the upper layer mask film remaining after the etching of the second electrode, etching the ferroelectric film and the first electrode using the middle layer mask film as an etching mask, removing the middle layer mask film remaining after the etching of the ferroelectric film and the first electrode, and removing the lower layer mask film.

14 Claims, 5 Drawing Sheets

METHOD FOR MANUFACTURING SEMICONDUCTOR DEVICE

BACKGROUND OF THE INVENTION

Field of the Invention

The present invention generally relates to a method for manufacturing a semiconductor device. More specifically, the present invention relates to a method for manufacturing a semiconductor device including a ferroelectric device.

In general, a ferroelectric capacitor in which a lower electrode such as platinum (Pt), a ferroelectric film such as lead zirconate titanate (PZT; $PbTiO_3$—$PbZrO_3$) and strontium bismuth tantalite (SBT; $SrBi_2Ta_2O_9$), and an upper electrode such as Pt are sequentially laminated has been known as a ferroelectric device. The ferroelectric capacitor can nonvolatilely retain data by using spontaneous birefringence of its ferroelectric film. Therefore, it has been used for a nonvolatile semiconductor memory such as a ferroelectric random access memory (FeRAM). The FeRAM shows much promise as an alternative memory for dynamic random access memory (DRAM), and thus various developments have been done for the FeRAM. In addition, it was confirmed that the FeRAM can operate at a low voltage. Accordingly, the FeRAM is much expected to be used as a low power consumption device.

Note that materials comprising upper and lower electrodes and a ferroelectric film in a ferroelectric capacitor, such as lead (Pb), zirconium (Zr), strontium (Sr), bismuth (Bi), tantalum (Ta), and platinum (Pt), are mostly processed with a mixed gas containing chlorine ($Cl_2$). In this case, both the chlorine vapor pressure and the chlorine volatility are low. Because of this, the chlorine volatility must be made higher in order to facilitate etching of those materials. Here, high chlorine volatility is generally accomplished by raising the wafer temperature by arranging a wafer on an high-temperature electrode of 350-450 degrees Celsius. Therefore, a hardmask consisting of titanium nitride (TiN), titanium aluminum nitride (TiAlN), silicon dioxide ($SiO_2$), silicon nitride (SiN) and the like is used for processing upper and lower electrodes and a ferroelectric film in a ferroelectric capacitor, instead of using a photoresist without the thermal resistance.

Methods for manufacturing a ferroelectric device using this type of hardmask have been proposed in the past. For example, Japan Patent Application Publication JP-A-2003-258201 discloses a method for manufacturing a ferroelectric device using a double-layer hardmask comprised of a lower layer hardmask comprised of TiN, Ta, TiAlN, and the like, and an upper layer hardmask comprised of a $SiO_2$ film. In this manufacturing method, an upper electrode comprised of iridium (Ir), Pt, and the like, a ferroelectric film comprised of SBT, PZT, and the like, a lower electrode comprised of Ir, Pt, and the like, and a conductive layer comprised of Ir, TiN, TiAlN, and the like, are continuously etched using an upper layer hardmask as an etching mask, and then the upper and lower layer hardmasks are sequentially removed.

Also, Japan Patent Application Publication JP-A-2003-273326 discloses a method for manufacturing a semiconductor device with a double-layer hardmask comprised of an upper layer hardmask comprised of a $SiO_2$ film and a lower layer hardmask comprised of a TiN film. In this manufacturing method, an upper electrode comprised of iridium oxide ($IrO_x$) and a ferroelectric film comprised of PZT are etched with the upper layer hardmask as an etching mask, and then an under etching is performed until etching is completed for a predetermined thickness of a lower electrode comprised of a multilayer film of a Pt film, an $IrO_x$ film, and an Ir film. Then, the remaining upper layer hardmask is removed. Next, the remaining lower electrode is etched using the lower layer hardmask as an etching mask. Then, the remaining lower layer hardmask is removed.

In addition, Japan Patent Application Publication JP-A-2003-273326 discloses a method for manufacturing a semiconductor device using a dual-layer hardmask comprised of an upper layer hardmask comprised of a plasma-enhanced chemical vapor deposited silicon nitride (P—SiN) film and a lower layer hardmask comprised of a TiN film. In this manufacturing method, an upper electrode comprised of $IrO_x$, a ferroelectric film comprised of PZT, and a lower electrode comprised of a multilayer film of a Pt film, an $IrO_x$ film, and an Ir film, are continuously etched using an upper layer hardmask as an etching mask, and then the upper and lower layer hardmasks are sequentially removed.

Furthermore, Japan Patent Application Publication JP-A-2003-273326 discloses a method for manufacturing a semiconductor device using a three-layer hardmask comprised of a upper layer hardmask comprised of a $SiO_2$ film, a middle layer hardmask comprised of a P—SiN film, and a lower layer hardmask comprised of a TiN film. In this manufacturing method, an upper electrode, a ferroelectric film, and a lower electrode are etched using the upper layer hardmask as an etching mask.

When a multilayer hardmask is used, a rough/uneven portion is formed in a remaining hardmask if the etching selectivity in each etching step varies. Thus, the film thickness of the remaining hardmask will be formed to be uneven. If removal of the hardmask is performed under this condition, the film thickness of an upper electrode in a ferroelectric capacitor will be formed to be uneven because the unevenness of the hardmask will be reflected thereon. As a result, some problems are caused which include a thinned upper electrode, facet, and a local void. In general, a thermal treatment is performed with respect to a ferroelectric capacitor after the capacitor is processed. This is because the process damage caused in processing the capacitor decreases the amount of remanent polarization. However, the following series of things are assumed. First, the metal forming an electrode in a thermal treatment will aggregate because of the above described upper electrode problems. Then, a ferroelectric film will be etched in a later contact hole process (i.e., a hole will be created in the electrode), and the amount of remanent polarization will be decreased. Thus, leak properties will markedly deteriorate.

As described above, according to Japan Patent Application Publication JP-A-2003-258201, etching is performed with respect to the upper electrode, the ferroelectric film, the lower film, and the conductive film using the upper layer hardmask comprised of $SiO_2$ as an etching mask. For example, if the upper and lower electrodes are comprised of Pt, the surface shape of the $SiO_2$ hardmask is formed to be a facet shape when etching is performed. This is because the etching selectivity of $SiO_2$ with respect to the upper and lower electrodes is low. Accordingly, the ferroelectric capacitor is formed to be a tapered shape when etching is performed. Thus miniaturization of the ferroelectric capacitor will be prevented. In addition, if the facet-state upper layer hardmask is removed, the lower layer hardmask formed under the upper layer hardmask will be formed to be a facet shape. Furthermore, if the lower layer hardmask is removed, the upper electrode will be formed to be in a facet shape.

On the other hand, according to the invention described in Japan Patent Application Publication JP-A-2003-273326, etching is performed with respect to the upper electrode, the ferroelectric film, and a portion of the lower electrode using the upper layer hardmask comprised of a $SiO_2$ film as an etching mask. Here, the etching selectivity of $SiO_2$ with respect to $IrO_x$ comprising the upper and lower electrodes is low. Therefore, the surface shape of the $SiO_2$ upper layer hardmask is formed to be in a facet shape when etching is performed. Accordingly, the ferroelectric capacitor is formed to be a tapered shape when etching is performed. Thus, miniaturization of the ferroelectric capacitor will be prevented. In addition, if the facet-state upper layer hardmask is removed, the lower layer hardmask formed under the upper layer hardmask will be formed to be a facet shape. Furthermore, if etching is performed with respect to the lower electrode using the lower layer hardmask as an etching mask and then the lower layer hardmask is removed, the upper electrode will be formed to be a facet shape.

In addition, according to the invention described in Japan Patent Application Publication JP-A-2003-273326, an example of a method for manufacturing a semiconductor device using an upper layer hardmask comprised of a P—SiN film is described. The P—SiN film is suitable for etching a ferroelectric film. However, its etching selectivity with respect to $IrO_x$ comprising the upper and lower electrodes is low, and thus the surface shape of the P—SiN film is formed to be a facet shape. Accordingly, the ferroelectric capacitor structure is formed to be a tapered shape when etching is performed. Thus, miniaturization of the ferroelectric capacitor will be prevented. In addition, if the facet-state upper layer hardmask is removed, the lower layer hardmask formed under the upper layer hardmask will be formed to be a facet shape. Furthermore, if the lower layer hardmask is removed, the upper electrode will be formed to be a facet shape.

Furthermore, according to the invention described in Japan Patent Application Publication JP-A-2003-273326, an example of a method for manufacturing a semiconductor device in which etching is performed with respect to an upper electrode, a ferroelectric film, and a lower electrode using a upper layer hardmask of a three-layer hardmask, which is comprised of a $SiO_2$ film, as an etching mask is described. Etching selectivity of the $SiO_2$ upper layer hardmask with respect to $IrO_x$ comprising the upper and lower electrodes is low. Accordingly, the surface shape of the $SiO_2$ upper layer hardmask is formed to be a facet shape. Thus, the ferroelectric capacitor structure is formed to be a tapered shape and miniaturization of the ferroelectric capacitor will be prevented. Furthermore, if the facet-state upper layer hardmask is removed, the middle layer hardmask will be formed to be a facet shape. Then, if the middle layer hardmask is removed under this condition, the lower layer hardmask will be a facet shape. Next, if the lower hardmask is removed under this condition, the lower electrode will be formed to be a facet shape.

In view of the above, it will be apparent to those skilled in the art from this disclosure that there exists a need for an improved method for manufacturing a semiconductor device. This invention addresses this need in the art as well as other needs, which will become apparent to those skilled in the art from this disclosure.

SUMMARY OF THE INVENTION

It is therefore an object of the present invention is to provide a method for manufacturing a semiconductor device including a ferroelectric device using a hardmask that can inhibit generation of an uneven-shaped upper electrode such as a facet-state upper electrode.

In accordance with the present invention, a method for manufacturing semiconductor device is comprised of the steps of (i) forming a circuit element on a semiconductor substrate, (ii) forming an insulation film that covers the circuit element, (iii) forming a first electrode on the insulation film, (iv) forming a ferroelectric film on the first electrode, (v) forming a second electrode on the ferroelectric film, (vi) forming a hardmask that has a predetermined pattern on the second electrode, which is comprised of a lower layer mask film whose etching selectivity to the second electrode is high, a middle layer mask film whose etching selectivity to the ferroelectric film is high, and an upper layer mask film whose etching selectivity to the first electrode is high, (vii) etching the second electrode using the upper layer mask film as an etching mask, (viii) removing the upper layer mask film remaining after the etching of the second electrode, (ix) etching the ferroelectric film and the first electrode using the middle layer mask film as an etching mask, (x) removing the middle layer mask film remaining after the etching of the ferroelectric film and the first electrode, (xi) and removing the lower layer mask film.

According to the present invention, up to two layers of the first electrode, the ferroelectric film, and the second electrode are etched using a one-layer hardmask. Therefore, it is possible to prevent the surface shape of the hardmask from being formed to be uneven, such as a facet shape. Because of this, it is possible to prevent the surface shape of the second electrode from being formed to be uneven when the hardmask is removed.

In addition, according to the present invention, the upper layer mask film remaining after the etching of the second electrode is removed. Therefore, it is possible to prevent the surface shape of the middle layer mask film from being formed to be uneven during the etching of the ferroelectric film and the first electrode. Furthermore, the middle layer mask remaining after the etching of the ferroelectric film and the first electrode is removed. Therefore, it is possible to prevent the surface shape of the lower layer mask film from being formed to be uneven. Also, if the lower layer mask film is removed, it is possible to reliably prevent the surface shape of the second electrode to be uneven.

These and other objects, features, aspects and advantages of the present invention will become apparent to those skilled in the art from the following detailed description, which, taken in conjunction with the annexed drawings, discloses a preferred embodiment of the present invention.

BRIEF DESCRIPTION OF THE DRAWINGS

Referring now to the attached drawings which form a part of this original disclosure.

DETAILED DESCRIPTION OF THE PREFERRED EMBODIMENTS

Selected embodiments of the present invention will now be explained with reference to the drawings. It will be apparent to those skilled in the art from this disclosure that the following descriptions of the embodiments of the present invention are provided for illustration only and not for the purpose of limiting the invention as defined by the appended claims and their equivalents.

First Embodiment

Referring now to FIGS. 1A to 1C, 2A to 2C, and 3A to 3C, a method for manufacturing a semiconductor device including a ferroelectric capacitor in accordance with a first embodiment of the present invention will now be explained. FIGS. 1A to 1C, 2A to 2C, and 3A to 3C are cross-section diagrams showing a manufacturing process of a semiconductor device.

Formation of Laminated Structure Film and Hardmask

Figure 1A:
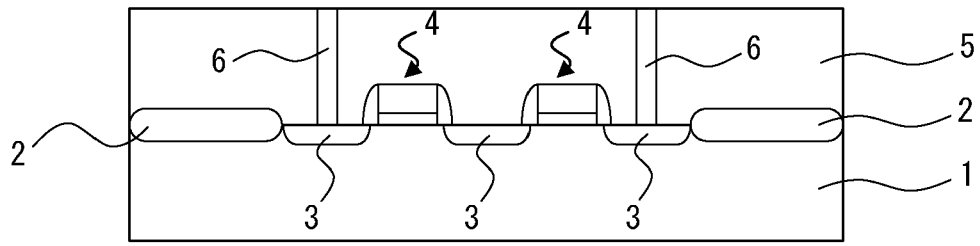
FIGS. 1A to 1C are cross-section diagrams showing a portion of a manufacturing process of a semiconductor device in accordance with a first embodiment and a second embodiment of the present invention.

As shown in FIG. 1A, an isolation region 2 using the local oxidation of silicon (LOCOS) technique and the like and a diffusion layer 3 are formed on a semiconductor substrate 1 with a heretofore known Si semiconductor process. Then, a gate dielectric and a gate electrode are formed on the semiconductor substrate 1. Thus a transistor 4 is formed. Next, an inter-layer dielectric 5 comprised of a silicon oxide film and the like is formed on the isolation region 2, the diffusion layer 3, and the transistor 4. Then, the inter-layer dielectric 5 is planarized. Next, an opening is formed in the inter-layer dielectric 5 exposing the diffusion layer 3 (i.e., a source/drain region 3), and tungsten (W) or polycrystal silicon (p-Si) is implanted into the opening. Thus a contact plug 11 is formed.

Figure 1B:
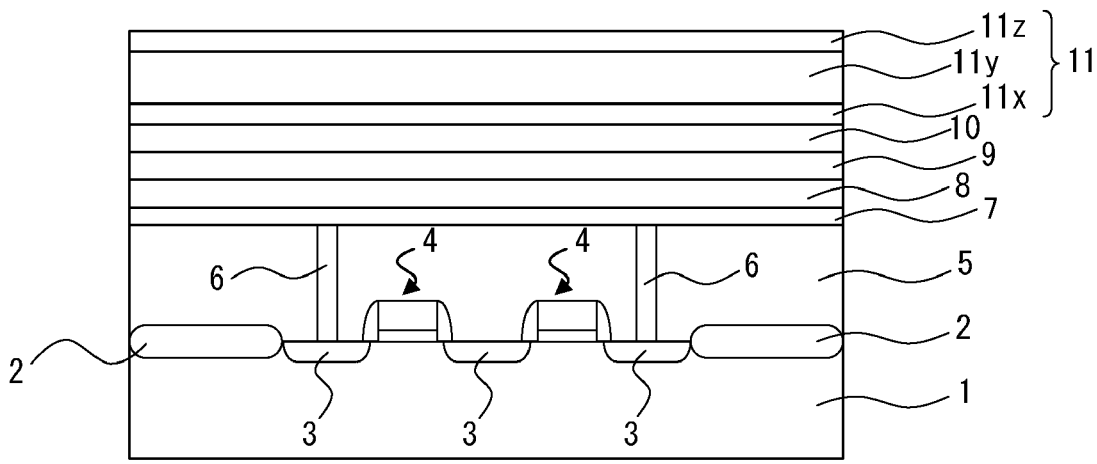

As shown in FIG. 1B, an adhesive layer 7 is formed on the inter-layer dielectric 5 with a sputtering method, for instance. Here, the adhesive layer 7 is comprised of TiAlN, and works as an antioxidant film to prevent the contact plug 11 from being oxidized. Note that material comprising the adhesive layer 7 is not limited to TiAlN and it may be other material. Then, a lower electrode 8 is formed on the adhesive layer 7 with a sputtering method, for instance. Here, the lower electrode 8 is comprised of a Pt film. Then, a ferroelectric film 9 is formed on the lower electrode 8 with a sol-gel method, for instance. Here, the ferroelectric film 9 is comprised of a SBT film. Next, crystallization of the ferroelectric film 9 is performed with a thermal treatment (this process is hereinafter called crystallization thermal treatment). More specifically, the thermal treatment is performed in an oxygen atmosphere at a high temperature of 700-750 degrees Celsius for 30-60 minutes. Note that the ferroelectric film 9 may be comprised of PZT and the like. Also, the method for forming the SBT film is not limited to the sol-gel method, and a chemical vapor deposition (CVD) method or the like may be used instead. Also, a rapid thermal anneal (RTA) treatment may be performed in an oxidation atmosphere at a high temperature of 800 degrees Celsius for 30-60 minutes as the crystallization thermal treatment. Next, an upper electrode 10 is formed on the ferroelectric film 9 with a sputtering method, for instance. Here, the upper electrode 10 is comprised of a Pt film. Thus, a laminated ferroelectric capacitor is comprised of the lower electrode 8, the ferroelectric film 9, and the upper electrode 10.

Next, a hardmask 11 is formed on the upper electrode 10. The hardmask 11 is used as an etching mask in a later process. The hardmask 11 is a three-layer etching mask formed by sequentially laminating a lower layer mask film 11x, a middle layer mask film 11y, and an upper layer mask film 11z. More specifically, the lower layer mask film 11x is formed with a sputtering method, for instance. The lower layer mask film 11x is comprised of a TiN film. The middle layer mask film 11y is formed with a plasma CVD method, for instance. The middle layer mask film 11y is comprised of a $SiO_2$ film. The upper layer mask film 11z is formed with a sputtering method, for instance. The upper layer mask film 11z is comprised of a TiN film. Here, the thicknesses of the lower layer mask film 11x, the middle layer mask film 11y, and the upper layer mask film 11z are set to be 100 nm, 600 nm, and 100 nm, respectively. Note that the lower layer mask film 11x and the upper layer mask film 11z may be comprised of TiAlN or titanium oxide ($TiO_x$) and the middle layer mask film 11y may be comprised of SiN or silicon oxy-nitride (SiON).

Etching of Hardmask

Figure 1C:
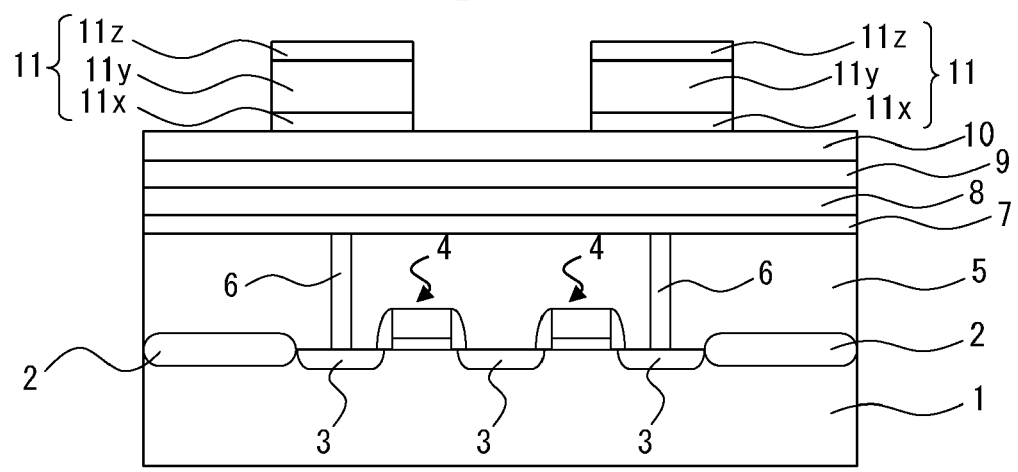

A resist (not shown in the figure) is formed on the upper layer mask film 11z, and an image of a capacitor pattern is printed on this resist with a heretofore known lithography technique. Then, as shown in FIG. 1C, etching is performed with respect to the upper layer mask film 11z, the middle layer mask film 11y, and the lower layer mask film 11x using the resist pattern as a mask.

Here, a mixed gas of boron trichloride ($BCl_3$) and $Cl_2$ is used for performing the etching of the upper layer mask film 11z. In addition, the etching conditions are set as follows. That is, the gas flow rates of $BCl_3$ and $Cl_2$ are set to be 20 and 20 sccm, respectively. The gas pressure is set to be 0.26 Pa. The RF power is set to be 700 W. The electrode temperature is set to be 80 degrees Celsius.

On the other hand, a mixed gas of octafluorocyclobutane ($C_4F_8$), argon (Ar), and carbon oxide (CO) is used for performing the etching of the middle layer mask film 11y. Here, the etching conditions are set as follows. That is, gas flow rates of $C_4F_8$, Ar, and CO are set to be 18, 300, and 400 sccm, respectively. The gas pressure is set to be 5.33 Pa. The RF power is set to be 1300 W. The electrode temperature is set to be 20 degrees Celsius.

In addition, the mixed gas of $BCl_3$ and $Cl_2$ is used for performing the etching of the lower layer mask film 11x. Here, the etching conditions are set as follows. That is, gas flow rates of $BCl_3$ and $Cl_2$ are set to be 20 and 20 sccm, respectively. The gas pressure is set to be 0.26 Pa. The RF power is set to be 700 W. The electrode temperature is set to be 80 degrees Celsius.

Then, heretofore known $O_2$ plasma ashing and sulphuric acid ($H_2SO_4$) washing are performed as a step of removing the resist pattern. In this embodiment, $H_2SO_4$ is for the step of removing the resist pattern, but a generally used organic release agent can be used for this step.

Etching of Laminated Structure Film and Adhesive Layer

Figure 2A:
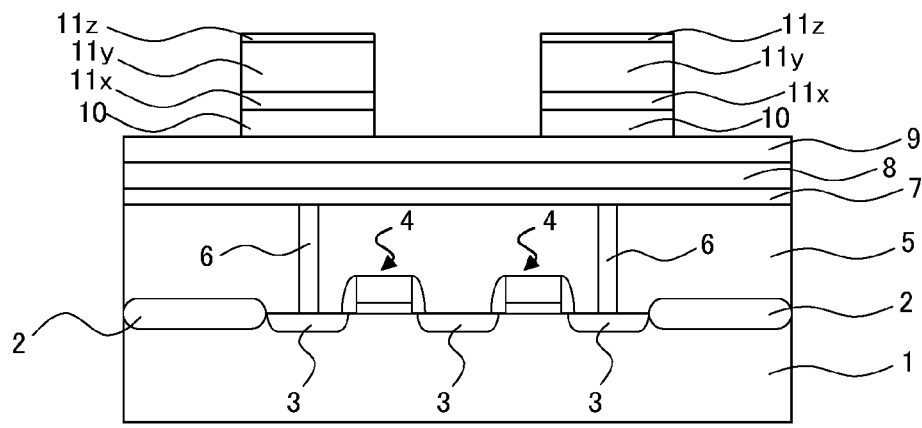
FIGS. 2A to 2C are cross-section diagrams showing a portion of a manufacturing process of a semiconductor device in accordance with the first embodiment of the present invention.

Next, after the patterning of the hardmask 11, as shown in FIG. 2A, etching is performed with respect to the upper electrode 10 of the laminated structure film of the ferroelectric capacitor using the upper layer mask film 11z as an etching mask. The mixed gas of $Cl_2$ and Ar is used for etching the upper electrode 10. Here, the etching conditions are set as follows. That is, gas flow rates of $Cl_2$ and Ar are set to be 10 and 10 sccm, respectively. The gas pressure is set to be 0.26 Pa. The RF power is set to be 1000 W. The electrode temperature is set to be 450 degrees Celsius. Note that a mixed gas of $Cl_2$ and other gases such as Ar, nitrogen ($N_2$), and oxygen ($O_2$) may be used for etching the upper electrode 10 instead of using a mixed gas of $Cl_2$ and Ar.

Figure 2B:
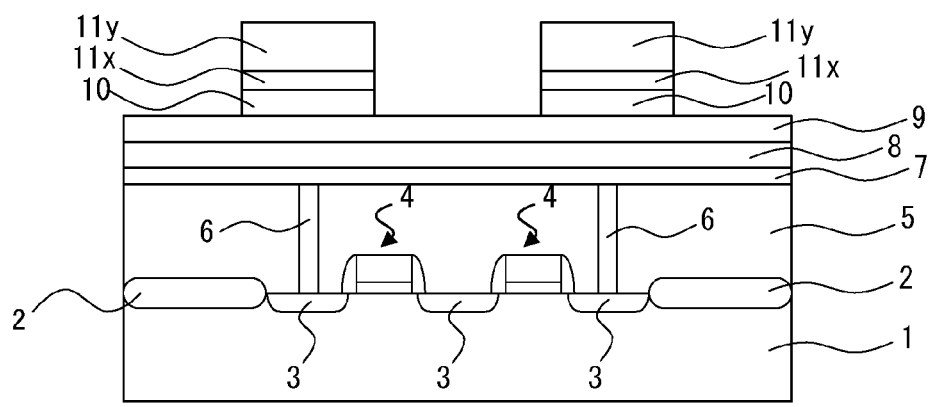

As shown in FIG. 2B, the remaining upper layer mask film 11z is removed with the mixed gas of $BCl_3$ and $Cl_2$. Here, the thickness of the remaining upper layer mask film 11z is 10-20 nm. The removal conditions are set as follows. That is, the gas flow rates of $BCl_3$ and $Cl_2$ are set to be 20 and 20 sccm, respectively. The gas pressure is set to be 0.26 Pa. The RF power is set to be 700 W. The electrode temperature is set to be 80 degrees Celsius.

Figure 2C:
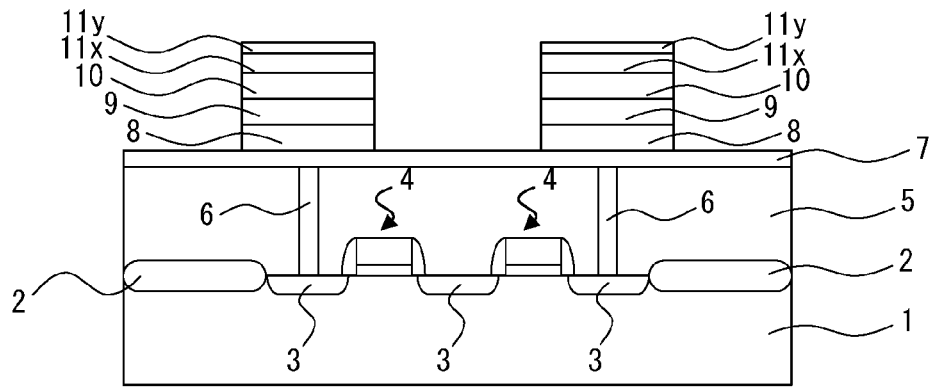

As shown in FIG. 2C, etching is performed with respect to the ferroelectric film 9 and the lower electrode 8 using the middle layer mask film 11y as an etching mask. The mixed gas of $Cl_2$ and Ar is used for etching the ferroelectric film 9 and the lower electrode 8. Here, the etching conditions are set as follows. That is, the gas flow rates of $Cl_2$ and Ar are set to be 10 and 10 sccm, respectively. The gas pressure is set to be 0.26 Pa. The RF power is set to be 1000 W. The electrode temperature is set to be 450 degrees Celsius. Note that a mixed gas of $Cl_2$ and other gases such as Ar, $N_2$, and $O_2$ may be used for the etching of the ferroelectric film 9 and the lower electrode 8 instead of using the mixed gas of $Cl_2$ and Ar.

Figure 3A:
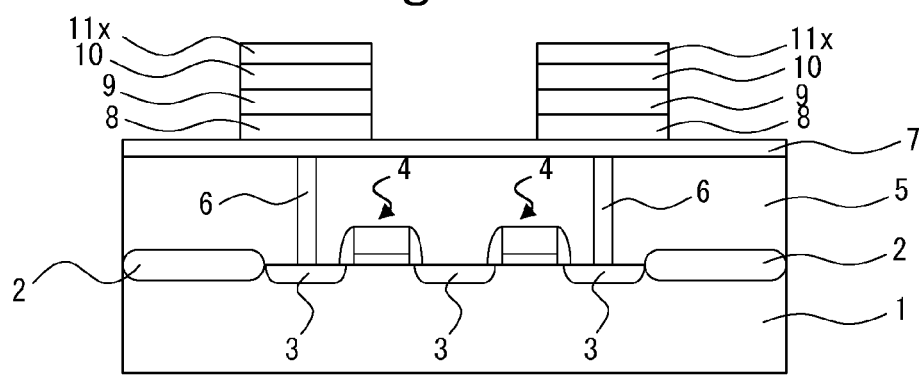
FIGS. 3A to 3C are cross-section diagrams showing a portion of a manufacturing process of a semiconductor device in accordance with the first embodiment of the present invention.

Next, as shown in FIG. 3A, the remaining middle layer mask film 11y is removed with a mixed gas of methane ($CH_4$), trifluoromethane ($CHF_3$), and Ar. Here, the thickness of the remaining middle layer mask film 11y is approximately 100 nm. The removal conditions are set as follows. That is, gas flow rates of $CH_4$, $CHF_3$, and Ar are set to be 45, 30, and 800 sccm. The gas pressure is set to be 66.66 Pa. The RF power is set to be 500 W. The electrode temperature is set to be 10 degrees Celsius below zero. Note that the mixed gas of $CH_4$, $CHF_3$, and Ar can be used under a low ion energy condition, and thus ion impact can be decreased to the extent that the lower layer mask film 11z is not patterned by the impact of the ions.

Figure 3B:
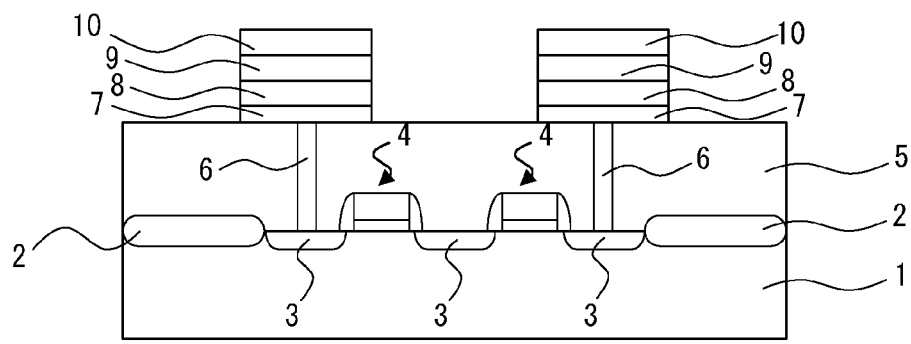

Next, as shown in FIG. 3B, etching is performed with respect to the adhesive layer 7 with the mixed gas of $Cl_2$ and Ar at the same time as removal of the lower layer mask film 11x. Here, the removal/etching conditions are set as follows. That is, the gas flow rates of $Cl_2$ and Ar are set to be 20 and 20 sccm, respectively. The gas pressure is set to be 0.65 Pa. The RF power is set to be 500 W. The electrode temperature is set to be 80 degrees Celsius.

Process after Etching of Laminated Structure Film and Adhesion Layer

Figure 3C:
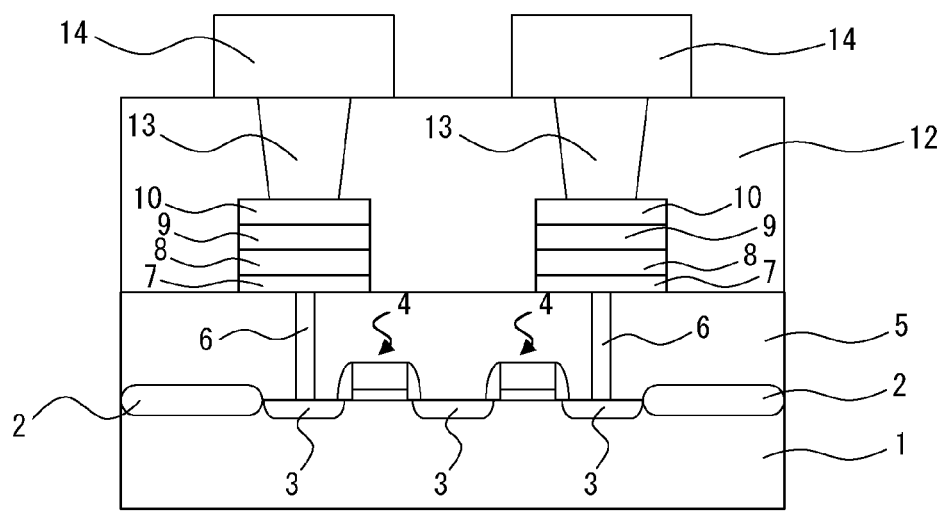

As shown in FIG. 3C, an inter-layer dielectric 12 is formed with a plasma CVD method, for instance. Then, the inter-layer dielectric 12 is planarized with an etch-back method and a chemical mechanical polishing (CMP) method. Next, a contact hole is formed which penetrates from the surface of the inter-layer dielectric 12 to the surface of the upper electrode 10 in each of the ferroelectric capacitors. Then, material such as tungsten (W) is implanted into the contact hole, and thus a conductive plug 13 is formed. Furthermore, a wiring layer is formed on the inter-layer dielectric 12, and a wiring 14 connected to the conductive plug 13 is formed by patterning the wiring layer.

According to the first embodiment of the present invention, the upper layer mask film 11z is used as an etching mask in the etching of the upper electrode 10. The upper layer mask film 11z is comprised of TiN, whose etching selectivity with respect to the upper electrode 10 comprised of Pt is high. In addition, a $SiO_2$ film is used as an etching mask in the etching of the ferroelectric film 9 and the lower electrode 8. The etching selectivity of the $SiO_2$ film with respect to the ferroelectric film 9 comprised of SBT is high. Therefore, it is easier to perform etching compared to a case in which etching is performed with respect to the upper electrode 10, the ferroelectric film 9, and the lower electrode 8 using only one mask. In addition, it is possible to prevent each layer of the hardmask 11 from being formed to be uneven such as a facet shape in an etching step. Accordingly, when the hardmask 11 is removed, it is possible to prevent the surface shape of the upper electrode 10 from being formed to be uneven.

In general, the process damage caused in the patterning of a ferroelectric capacitor can decrease the amount of remanent polarization. Because of this, a thermal treatment is performed after the patterning of the ferroelectric capacitor. Thus, the metal forming an electrode will aggregate during the thermal treatment, even if problems including a thinned film thickness, a facet shape, and a local void are caused with respect to the upper electrode. Accordingly, a ferroelectric film can be etched (i.e., a hole will be created in the electrode) in a later process of creating a contact hole, and the amount of remanent polarization will decrease, and leak properties will markedly deteriorate. According to the first embodiment of the present invention, it is possible to prevent the surface shape of the upper electrode 10 from being formed to be uneven. Therefore, these problems can be prevented from occurring. Accordingly, the yield of a ferroelectric element can be stabilized and its reliability can be enhanced.

In addition, if a film including Ti is exposed to a high-temperature atmosphere including oxygen, a $TiO_x$ layer will be formed. The $TiO_x$ layer has strong bonding strength and is as stable as $SiO_2$. Therefore, a method of increasing ion energy by increasing the RF power, or a method of using the etching gas including reducing material (hydrogen or boron) can be suggested for the purpose of removing $TiO_x$.

However, if ion energy is increased, a problem will be caused in which the crystalline structure of a ferroelectric film will collapse and the amount of remanent polarization will decrease. In addition, the etching selectivity with respect to the lower layer will decrease, and thus a rough/uneven portion will tend to be formed which causes a facet portion of the upper electrode.

On the other hand, when an etching gas including a reducing material is used, the ferroelectric film will deteriorate due to the reducing material. This is because the ferroelectric film is a metal-oxide film. For example, it is well known that the ferroelectric film will deteriorate due to reduction if it is exposed to a reducing gas including boron in a high-temperature atmosphere at 80 degrees Celsius or more.

Therefore, $TiO_x$ must be removed by using an etching gas including a reducing material before the patterning of the ferroelectric film, that is, before a sidewall of the ferroelectric film is formed.

According to the first embodiment of the present invention, the TiN upper layer mask film 11z is removed using the mixed gas of $BCl_3$ and $Cl_2$ before the etching of the ferroelectric film 9, that is, before a sidewall of the ferroelectric film 9 is formed. Because of this, even if $O_2$ is included in the mixed gas including $Cl_2$ and a $TiO_x$ layer is formed, it will be easy to remove the TiN layer when the $TiO_x$ layer is formed using a reducing gas. In addition, it is possible to inhibit damage to the ferroelectric film 9 (e.g., deterioration due to reduction) as much as possible when the TiN layer is removed.

Second Embodiment

Referring now to FIGS. 1A to 1C, 4A to 4D, and 5A to 5C, a method for manufacturing a semiconductor device including a ferroelectric capacitor in accordance with a second embodiment of the present invention will now be explained. In view of the similarity between the first and second embodiments, the parts of the second embodiment that are identical to the parts of the first embodiment will be given the same reference numerals as the parts of the first embodiment. Moreover, the descriptions of the parts of the second embodiment that are identical to the parts of the first embodiment may be omitted for the sake of brevity.

FIGS. 1A to 1C, 4A to 4D, and 5A to 5C are cross-section diagrams showing a manufacturing process of a semiconductor device in accordance with the second embodiment of the present invention.

Formation of Laminated Structure Film and Hardmask

As shown in FIG. 1A, an isolation region 2 using the local oxidation of silicon (LOCOS) technique and the like and a diffusion layer 3 are formed on a semiconductor substrate 1 with a heretofore known Si semiconductor process. Then, a gate dielectric and a gate electrode are formed on the semiconductor substrate 1. Thus, a transistor 4 is formed. Next, an inter-layer dielectric 5 comprised of a silicon oxide film and the like is formed on the isolation region 2, the diffusion layer 3, and the transistor 4. Then, the inter-layer dielectric 5 is planarized. Next, an opening is formed in the inter-layer dielectric 5 exposing the diffusion layer 3 (i.e., a source/drain region 3), and tungsten (W) or polycrystal silicon (p-Si) is implanted into the opening. Thus, a contact plug 11 is formed.

As shown in FIG. 1B, an adhesive layer 7 is formed on the inter-layer dielectric 5 with a sputtering method, for instance. Here, the adhesive layer 7 is comprised of TiAlN and works as an antioxidant film to prevent the contact plug 11 from being oxidized. Note that the material comprising the adhesive layer 7 is not limited to TiAlN, and it may be other material. Then, a lower electrode 8 is formed on the adhesive layer 7 with a sputtering method, for instance. Here, the lower electrode 8 is comprised of a Pt film. Then, a ferroelectric film 9 is formed on the lower electrode 8 with a sol-gel method, for instance. Here, the ferroelectric film 9 is comprised of a SBT film. Next, crystallization of the ferroelectric film 9 is performed with a thermal treatment (this process is hereinafter called a crystallization thermal treatment). More specifically, the thermal treatment is performed in an oxygen atmosphere at a high temperature of 700-750 degrees Celsius for 30-60 minutes. Note that the ferroelectric film 9 may be comprised of PZT and the like. Also, a method for forming the SBT film is not limited to the sol-gel method, and a chemical vapor deposition (CVD) method or the like may be used instead. Also, a rapid thermal anneal (RTA) treatment may be performed in an oxidation atmosphere at a high temperature of 800 degrees Celsius for 30-60 minutes as the crystallization thermal treatment. Next, an upper electrode 10 is formed on the ferroelectric film 9 with a sputtering method, for instance. Here, the upper electrode 10 is comprised of a Pt film. Thus, a laminated ferroelectric capacitor is comprised of the lower electrode 8, the ferroelectric film 9, and the upper electrode 10.

Next, a hardmask 11 is formed on the upper electrode 10. The hardmask 11 is used as an etching mask in a later process. The hardmask 11 is a three-layer etching mask formed by sequentially laminating a lower layer mask film 11x, a middle layer mask film 11y, and an upper layer mask film 11z. More specifically, the lower layer mask film 11x is formed with a sputtering method, for instance. The lower layer mask film 11x is comprised of a TiN film. The middle layer mask film 11y is formed with a plasma CVD method, for instance. The middle layer mask film 11y is comprised of a $SiO_2$ film. The upper layer mask film 11z is formed with a sputtering method, for instance. The upper layer mask film 11z is comprised of a TiN film. Here, thicknesses of the lower layer mask film 11x, the middle layer mask film 11y, and the upper layer mask film 11z are set to be 100 nm, 600 nm, and 100 nm, respectively. Note that the lower layer mask film 11x and the upper layer mask film 11z may be comprised of TiAlN or titanium oxide ($TiO_x$), and the middle layer mask film 11y may be comprised of SiN or silicon oxy-nitride (SiON).

Etching of Hardmask

A resist (not shown in the figure) is formed on the upper layer mask film 11z, and an image of a capacitor pattern is printed on this resist with a heretofore known lithography technique. Then, as shown in FIG. 1C, etching is performed with respect to the upper layer mask film 11z, the middle layer mask film 11y, and the lower layer mask film 11x using the resist pattern as a mask.

Here, the mixed gas of boron trichloride ($BCl_3$) and $Cl_2$ is used for performing the etching of the upper layer mask film 11z. In addition, the etching conditions are set as follows. That is, the gas flow rates of $BCl_3$ and $Cl_2$ are set to be 20 and 20 sccm, respectively. The gas pressure is set to be 0.26 Pa. The RF power is set to be 700 W. The electrode temperature is set to be 80 degrees Celsius.

On the other hand, the mixed gas of octafluorocyclobutane ($C_4F_8$), argon (Ar), and carbon oxide (CO) is used for performing the etching of the middle layer mask film 11y. Here, the etching conditions are set as follows. That is, the gas flow rates of $C_4F_8$, Ar, and CO are set to be 18, 300, and 400 sccm, respectively. The gas pressure is set to be 5.33 Pa. The RF power is set to be 1300 W. The electrode temperature is set to be 20 degrees Celsius.

In addition, the mixed gas of $BCl_3$ and $Cl_2$ is used for performing the etching of the lower layer mask film 11x. Here, the etching conditions are set as follows. That is, gas flow rates of $BCl_3$ and $Cl_2$ are set to be 20 and 20 sccm, respectively. The gas pressure is set to be 0.26 Pa. The RF power is set to be 700 W. The electrode temperature is set to be 80 degrees Celsius.

Then, heretofore known $O_2$ plasma ashing and sulphuric acid ($H_2SO_4$) washing are performed as a step of removing the resist pattern. In this embodiment, $H_2SO_4$ is for the step of removing the resist pattern, but a generally used organic release agent can be used for the step.

Etching of Laminated Structure Film and Adhesive Layer

Figure 4A:
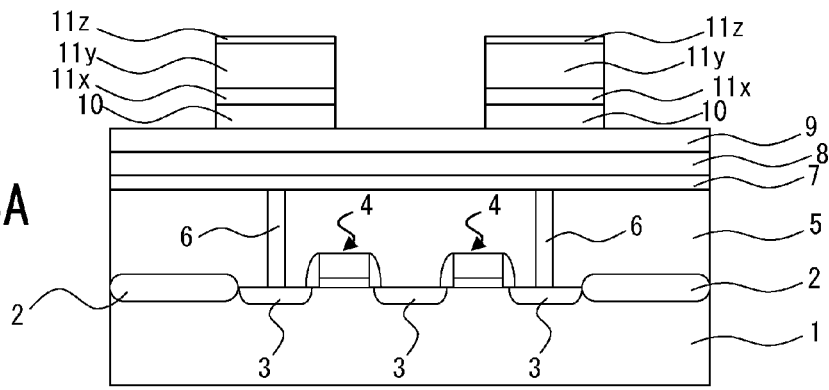
FIG. 4A to FIG. 4D are cross-section diagrams showing a portion of a manufacturing process of a semiconductor device in accordance with the second embodiment of the present invention.

Next, after the patterning of the hardmask 11, as shown in FIG. 4A, etching is performed with respect to the upper electrode 10 of the laminated structure film of the ferroelectric capacitor using the upper layer mask film 11z as an etching mask. The mixed gas of $Cl_2$ and Ar is used for etching the upper electrode 10. Here, the etching conditions are set as follows. That is, the gas flow rates of $Cl_2$ and Ar are set to be 10 and 10 sccm, respectively. The gas pressure is set to be 0.26 Pa. The RF power is set to be 1000 W. The electrode temperature is set to be 450 degrees Celsius. Note that the mixed gas of $Cl_2$ and other gases such as Ar, nitrogen ($N_2$), and oxygen ($O_2$) may be used for etching the upper electrode 10 instead of using the mixed gas of $Cl_2$ and Ar.

Figure 4B:
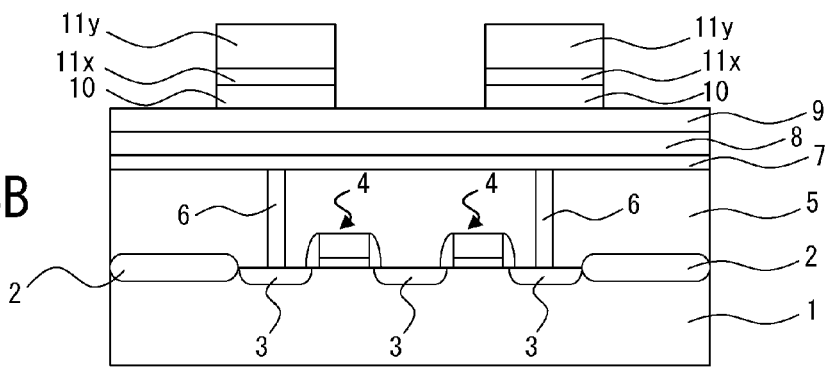

As shown in FIG. 4B, the remaining upper layer mask film 11z is removed with the mixed gas of $BCl_3$ and $Cl_2$. Here, thickness of the remaining upper layer mask film 11z is 10-20 nm. The removal conditions are set as follows. That is, the gas flow rates of $BCl_3$ and $Cl_2$ are set to be 20 and 20 sccm, respectively. The gas pressure is set to be 0.26 Pa. The RF power is set to be 700 W. The electrode temperature is set to be 80 degrees Celsius.

Figure 4C:
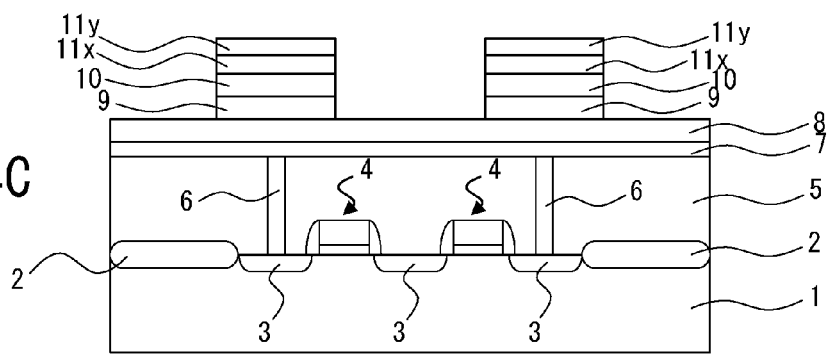

As shown in FIG. 4C, etching is performed with respect to the ferroelectric film 9 using the middle layer mask film 11y as an etching mask. The mixed gas of $Cl_2$ and Ar is used for etching the ferroelectric film 9. Here, the etching conditions are set as follows. That is, the gas flow rates of $Cl_2$ and Ar are set to be 10 and 10 sccm, respectively. The gas pressure is set to be 0.26 Pa. The RF power is set to be 1000 W. The electrode temperature is set to be 450 degrees Celsius. Note that the mixed gas of $Cl_2$ and other gases such as Ar, $N_2$, and $O_2$ may be used for the etching of the ferroelectric film 9 and the lower electrode 8 instead of using the mixed gas of $Cl_2$ and Ar.

Figure 4D:
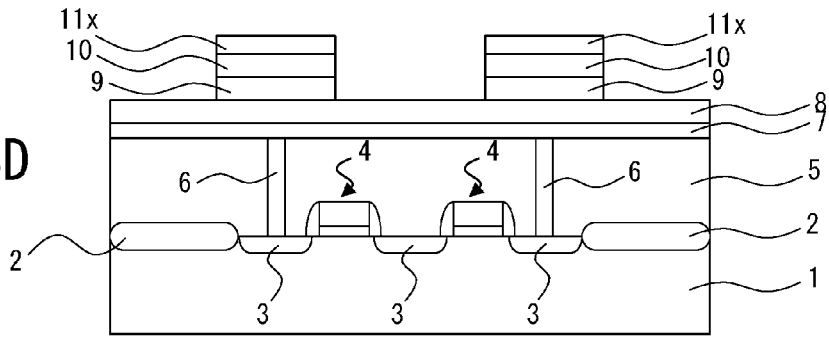

Next, as shown in FIG. 4D, the remaining middle layer mask film 11y is removed with a mixed gas of methane ($CH_4$), trifluoromethane ($CHF_3$), and Ar. Here, the removal conditions are set as follows. That is, the gas flow rates of $CH_4$, $CHF_3$, and Ar are set to be 45, 30, and 800 sccm. The gas pressure is set to be 66.66 Pa. The RF power is set to be 500 W. The electrode temperature is set to be 10 degrees Celsius below zero. Note that the mixed gas of $CH_4$, $CHF_3$, and Ar can be used under a low ion energy condition, and thus ion impact can be decreased to the extent that the lower layer mask film 11z is not patterned by the impact of ions.

Figure 5A:
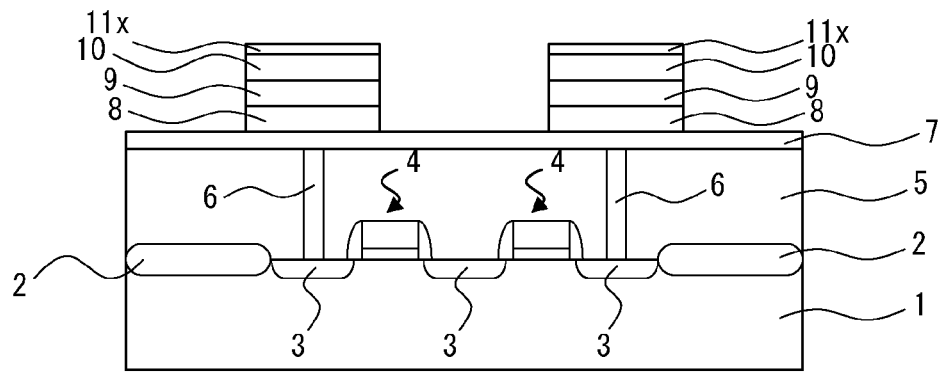
FIGS. 5A to 5C are cross-section diagrams showing a portion of a manufacturing process of a semiconductor device in accordance with the second embodiment of the present invention.

Next, as shown in FIG. 5A, etching is performed with respect to the lower electrode 8 using the lower layer mask film 11x as an etching mask. The mixed gas of $Cl_2$ and Ar is used for the etching of the lower electrode 8. Here, the etching conditions are set as follows. That is, the gas flow rates of $Cl_2$ and Ar are set to be 20 and 20 sccm, respectively. The gas pressure is set to be 0.65 Pa. The RF power is set to be 500 W. The electrode temperature is set to be 80 degrees Celsius. Note that a $TiO_x$ film is formed on the surface of the TiN lower layer mask film 11x and the surface of the adhesive layer 7 after the etching of the lower electrode 8. Note that the mixed gas of $Cl_2$ and other gases such as Ar, $N_2$, and $O_2$ may be used for the etching of the lower electrode 8 instead of using the mixed gas of $Cl_2$ and Ar.

Figure 5B:
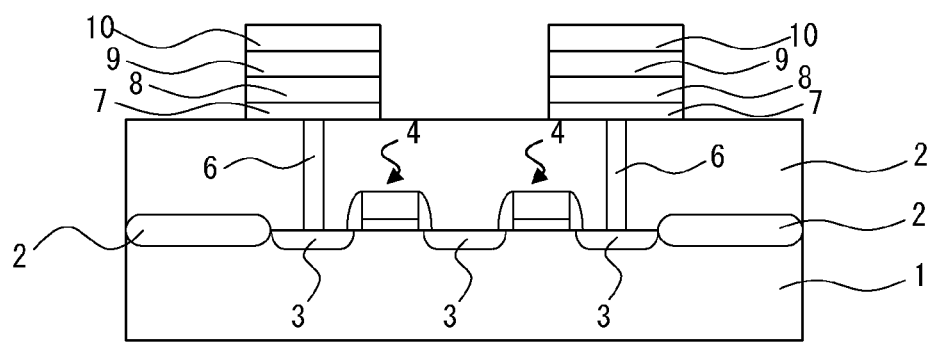

Next, as shown in FIG. 5B, etching is performed with respect to the adhesive layer 7 with the mixed gas of $Cl_2$ and Ar at the same time as removal of the remaining lower layer mask film 11x. Here, the removal/etching conditions are set as follows. That is, gas flow rates of $Cl_2$ and Ar are set to be 20 and 20 sccm, respectively. The gas pressure is set to be 0.65 Pa. The RF power is set to be 500 W. The electrode temperature is set to be 80 degrees Celsius.

Note that the $TiO_x$ film formed on the surface of the lower layer mask film 11x and the surface of the adhesive layer 7 are removed at the same time as this step.

Process after etching of laminated structure film and adhesion layer

Figure 5C:
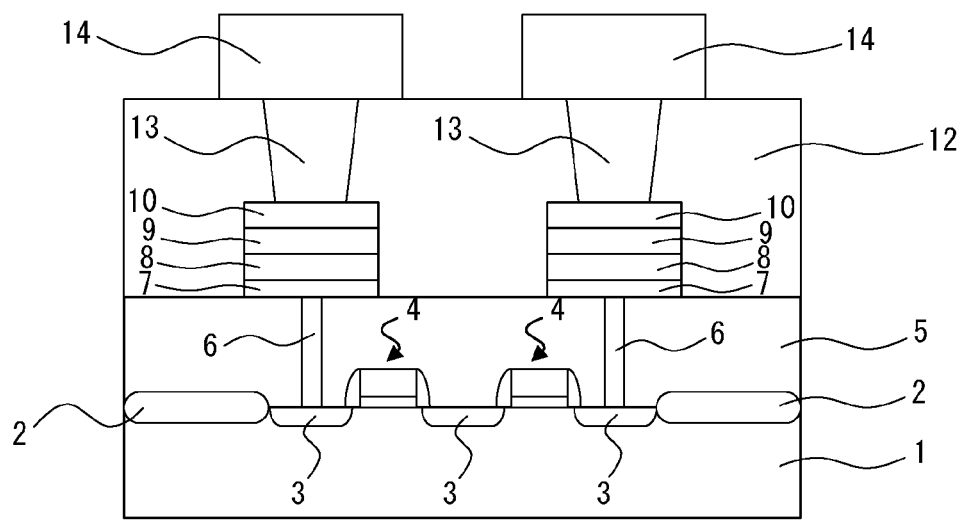

As shown in FIG. 5C, an inter-layer dielectric 12 is formed with a plasma CVD method, for instance. Then, the inter-layer dielectric 12 is planarized with an etch-back method and a chemical mechanical polishing (CMP) method. Next, a contact hole is formed which penetrates from the surface of the inter-layer dielectric 12 to the surface of the upper electrode 10 in each of the ferroelectric capacitors. Then, material such as tungsten (W) is implanted into the contact hole, and thus a conductive plug 13 is formed. Furthermore, a wiring layer is formed on the inter-layer dielectric 12, and a wiring 14 connected to the conductive plug 13 is formed by patterning the wiring layer.

According to the first embodiment of the present invention, the upper layer mask film 11z is used as an etching mask in the etching of the upper electrode 10. The upper layer mask film 11z is comprised of TiN whose etching selectivity with respect to the upper electrode 10 comprised of Pt is high. In addition, a $SiO_2$ film is used as an etching mask in the etching of the ferroelectric film 9 and the lower electrode 8. The etch rate of the $SiO_2$ film with respect to the ferroelectric film 9 comprised of SBT is high. Furthermore, the lower layer mask film 11x is used as an etching mask in the etching of the lower electrode 8. Here, the lower layer mask film 11x is comprised of TiN, and etching selectivity of TiN with respect to the lower electrode 8 comprised of Pt. Therefore, it is easier to perform etching compared to a case in which etching is performed with respect to at least two of the upper electrode 10, the ferroelectric film 9, and the lower electrode 8 using only one mask. In addition, it is possible to prevent each layer of the hardmask 11 from being formed to be uneven, such as a facet shape in an etching step. Accordingly, when the hardmask 11 is removed, it is possible to prevent the surface shape of the upper electrode 10 from being formed to be uneven.

In addition, according to the second embodiment of the present invention, each of the upper layer mask film 11z, the middle layer mask film 11y, and the lower layer mask film 11x is used as an etching mask of the upper layer 10, the ferroelectric film 9, and the lower electrode 8, respectively. Therefore, it is possible to set the film thickness of each mask film to be an appropriate thickness. Accordingly, not only the film thickness of the hardmask 11 can be formed to be thin, but the removal time and the formation time of the hardmask 11 can be reduced. According to the second embodiment of the present invention, the TiN upper layer mask film 11z is removed using a mixed gas of $BCl_3$ and $Cl_2$ before the etching of the ferroelectric film 9. Because of this, even if $O_2$ is included in the mixed gas including $Cl_2$ and a $TiO_x$ layer is formed, it will be easy to remove the TiN layer when the $TiO_x$ layer is formed using the reducing gas. In addition, it is possible to inhibit damage to the ferroelectric film 9 (e.g., deterioration due to reduction) as much as possible when the TiN layer is removed.

The term "configured" as used herein to describe a component, section or part of a device includes hardware and/or software that is constructed and/or programmed to carry out the desired function.

Moreover, terms that are expressed as "means-plus function" in the claims should include any structure that can be utilized to carry out the function of that part of the present invention.

The terms of degree such as "approximately" as used herein mean a reasonable amount of deviation of the modified term such that the end result is not significantly changed. For example, these terms can be construed as including a deviation of at least ±5% of the modified term if this deviation would not negate the meaning of the word it modifies.

This application claims priority to Japanese Patent Application No. 2005-179413. The entire disclosure of Japanese Patent Application No. 2005-179413 is hereby incorporated herein by reference.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents. Thus, the scope of the invention is not limited to the disclosed embodiments.

What is claimed is:

1. A method for manufacturing a semiconductor device, comprising the steps of:
   forming a circuit element on a semiconductor substrate;
   forming an insulation film that covers the circuit element;
   forming a first electrode on the insulation film;
   forming a ferroelectric film on the first electrode;
   forming a second electrode on the ferroelectric film;
   forming a hardmask that has a predetermined pattern on the second electrode, the hardmask comprised of:
      an upper layer mask film whose etching selectivity to the second electrode is high; and
      a middle layer mask film whose etching selectivity to the ferroelectric film is high;
   etching the second electrode using the upper layer mask film as an etching mask;
   removing the upper layer mask film remaining after the etching of the second electrode, the removal of the upper layer mask film being performed immediately after the etching of the second electrode;
   etching the ferroelectric film and the first electrode using the middle layer mask film as an etching mask, after removing the upper layer mask film; and
   removing the middle layer mask film remaining after the etching of the ferroelectric film and the first electrode.

2. The method for manufacturing the semiconductor device according to claim 1, wherein the upper layer mask film is comprised of a chemical compound that includes titanium (Ti).

3. The method for manufacturing the semiconductor device according to claim 2, wherein the chemical compound that includes Ti is one selected from the group consisting of titanium nitride (TiN), titanium aluminum nitride (TiAlN), and titanium oxide ($TiO_x$).

4. The method for manufacturing the semiconductor device according to claim 1, wherein the hardmask further includes a lower layer mask film, and the lower layer mask film is comprised of a chemical compound that includes Ti.

5. The method for manufacturing the semiconductor device according to claim 4, wherein the chemical compound that includes Ti is one selected from the group consisting of TiN, TiAlN, and $TiO_x$.

6. The method for manufacturing the semiconductor device according to claim 1, wherein the middle layer mask film is comprised of an oxide.

7. The method for manufacturing the semiconductor device according to claim 6, wherein the oxide is one selected from the group consisting of silicon dioxide ($SiO_2$) and silicon oxy-nitride (SiON).

8. The method for manufacturing the semiconductor device according to claim 1, wherein the middle layer mask film is comprised of nitride.

9. The method for manufacturing the semiconductor device according to claim 8, wherein the nitride is one selected from the group consisting of silicon nitride (SiN) and SiON.

10. The method for manufacturing the semiconductor device according to claim 1, wherein the first electrode and the second electrode are comprised of platinum (Pt) and the ferroelectric film is comprised of strontium bismuth tantalite (SBT; $SrBi_2Ta_2O_9$).

11. The method for manufacturing the semiconductor device according to claim 1, wherein the etching of the ferroelectric film and the etching of the first electrode are performed under the same condition using gas comprising chlorine ($Cl_2$).

12. The method for manufacturing the semiconductor device according to claim 1, wherein the removal of the upper layer mask film is performed using a reducing gas.

13. The method for manufacturing the semiconductor device according to claim 12, wherein the reducing gas comprises boron trichloride ($BCl_3$).

14. The method for manufacturing the semiconductor device according to claim 1, wherein the hardmask further includes a lower layer mask film, and the method further comprises the step of removing the lower layer mask film, and the removal of the lower layer mask film is performed at 80 degrees Celsius or less without using a reducing gas.

* * * * *